United States Patent
Li et al.

(10) Patent No.: US 11,437,080 B2
(45) Date of Patent: Sep. 6, 2022

(54) SYSTEMS AND METHODS FOR TRANSMITTING CLOCK SIGNALS ASYNCHRONOUSLY TO DUAL-PORT MEMORY CELLS

(71) Applicant: GLOBALFOUNDRIES U.S. INC., Santa Clara, CA (US)

(72) Inventors: Xiaoxiao Li, Shanghai (CN); Lei Zhang, Wuhan (CN)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 17/092,384

(22) Filed: Nov. 9, 2020

(65) Prior Publication Data
US 2022/0148633 A1  May 12, 2022

(51) Int. Cl.
*G11C 7/22* (2006.01)
*G11C 7/10* (2006.01)

(52) U.S. Cl.
CPC ............ *G11C 7/222* (2013.01); *G11C 7/1012* (2013.01); *G11C 7/1057* (2013.01); *G11C 7/1075* (2013.01); *G11C 7/1084* (2013.01)

(58) Field of Classification Search
CPC ..... G11C 7/222; G11C 7/1012; G11C 7/1057; G11C 7/1075; G11C 7/1084
See application file for complete search history.

(56) References Cited

U.S. PATENT DOCUMENTS

| | | | |
|---|---|---|---|
| 6,671,842 B1* | 12/2003 | Phan | G11C 29/12 |
| | | | 714/733 |
| 8,103,918 B2* | 1/2012 | Aitken | G11C 29/14 |
| | | | 714/718 |
| 9,530,488 B1 | 12/2016 | Balasubramanian et al. | |
| 9,569,305 B2* | 2/2017 | Mukai | G11C 8/16 |
| 2008/0298148 A1* | 12/2008 | Nagata | G11C 29/02 |
| | | | 365/201 |

OTHER PUBLICATIONS

Anonymous, "Tessent MemoryBIST User's Manual: For use with Tessent Shell," Software Version 2017.4, Dec. 2017, 586 pages.
Anonymous, "SRAM2S—Compilable dual-port SRAM," SA15-6470, Revision 03, Jun. 26, 2015, 24 pages.
Anonymous, "Tessent MemoryBIST User's Manual: For use with Tessent Shell," Software Version 2017.4, Dec. 2017, 440 pages.

* cited by examiner

*Primary Examiner* — Vanthu T Nguyen
(74) *Attorney, Agent, or Firm* — David Cain; Hoffman Warnick LLC (57) ABSTRACT

Embodiments of the disclosure provide systems and methods for transmitting clock signals asynchronously to dual-port memory cells. A system according to embodiments of the disclosure may include a source clock configured to generate a clock signal, a dual-port memory cell having a first input port, and a second input port coupled to the source clock. A clock tuner coupled between the source clock and the first input port of the dual-port memory cell delays the clock signal by one of a plurality of delay times and transmits the clock signal to the first input port.

17 Claims, 6 Drawing Sheets

SYSTEMS AND METHODS FOR TRANSMITTING CLOCK SIGNALS ASYNCHRONOUSLY TO DUAL-PORT MEMORY CELLS

TECHNICAL FIELD

Embodiments of the disclosure relate generally to the operating of logic circuits. More specifically, embodiments of the disclosure provide systems and methods to transmit clock signals asynchronously to dual-port memory cells.

BACKGROUND

One type of digital circuit element is a memory cell, which can be provided as "static RAM" (SRAM) or "dynamic RAM" (DRAM). Several transistors can be electrically connected to each other to provide fundamental elements of a memory cell architecture. Other implementations, e.g., magnetic ram, resistive ram, etc., which lack transistors and/or use transistors to perform different functions, are also possible. In the case of a transistor-based SRAM, the memory cell may include six transistors, four of which can be wired to form two cross-coupled voltage inverters for storing binary digits (also known as "bits") in the form of "high" and "low" voltages, i.e., voltages above or below a predetermined threshold. The remaining two transistors in an SRAM structure are known as "access transistors," so named because these transistors can control electrical access to the SRAM cell during read and write operations. The writing of data to, and the reading of data from, a memory cell may be implemented through a set of electrical ports. Some types of memory cells, particularly SRAM cells, may include two distinct ports for reading and/or writing of data. To test a product, a test clock may transmit a clock signal to each port of the memory cell. However, this may not truly reflect the manner in which an SRAM cell or other dual-port memory cell functions in a device.

SUMMARY

Aspects of the disclosure provide a system including: a source clock configured to generate a clock signal; a dual-port memory cell having a first input port, and a second input port coupled to the source clock; and a clock tuner coupled between the source clock and the first input port of the dual-port memory cell, wherein the clock tuner delays the clock signal by one of a plurality of delay times and transmits the clock signal to the first input port.

Further aspects of the disclosure provide a system including: a source clock configured to generate a clock signal; a dual-port memory cell having a first input port and a second input port; a first clock tuner coupled between the source clock and the first input port of the dual-port memory cell, wherein the first clock tuner delays the clock signal by one of a first plurality of delay times and transmits the clock signal to the first input port; a second clock tuner coupled between the source clock and the second input port of the dual-port memory cell, wherein the second clock tuner delays the clock signal by one of a second plurality of delay times and transmits the clock signal to the second input port; and a controller coupled to each of the first clock tuner and the second clock tuner, wherein the controller selects one of the first plurality of delay times and one of the second plurality of delay times such that the first clock tuner transmits the clock signal to the first clock port asynchronously with the second clock tuner transmitting the clock signal to the second clock port Additional aspects of the disclosure provide a method including: transmitting a clock signal to a first clock tuner and a second clock tuner, wherein the first clock tuner is coupled to a first input port of a dual-port memory cell, and wherein the second clock tuner is coupled to a second input port of the dual-port memory cell; delaying the clock signal by a selected one of a first plurality of delay times in the first clock tuner; delaying the clock signal by a selected one of a second plurality of delay times in the second clock tuner, wherein the selected one of the second plurality of delay times is different from the selected one of the first plurality of delay times; and transmitting the clock signal from the first clock tuner to the first input port of the dual-port memory cell with the selected one of the first plurality of delay times; and transmitting the clock signal from the second clock tuner to the second input port of the dual-port memory cell with the selected one of the second plurality of delay times, such that the dual-port memory cell receives the clock signal at the second input port asynchronously with the clock signal at the first input port.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure provide systems and methods for transmitting clock signals asynchronously to dual-port memory cells. A dual-port memory cell may include, e.g., a static random access memory (SRAM) cell with two input ports for reading and writing of data. Embodiments of the disclosure differ from conventional systems (e.g., built-in self-test or "BIST" circuits) by allowing one source clock to asynchronously deliver clock pulses to the two input ports of the memory cell. Thus, embodiments of the disclosure allow a digital circuit to more accurately test the behavior of a dual-port memory cell than comparable systems that transmit synchronous clock pulses to the two ports. A system according to embodiments of the disclosure may include a source clock for generating a clock signal, and a dual-port memory cell. The dual-port memory cell includes a first input port, and a second input port coupled to the source clock. A clock tuner coupled between the source clock and the first input port of the dual-port memory cell delays the clock signal by one of several possible delay times, and transmits the clock signal to the first input port. During operation, the clock signal will arrive at the first input port later than the second input port. The clock tuner may be external to the dual-port memory cell, such that it operates independently of the cell. In further implementations, each input port to the memory cell may have its own corresponding clock tuner to further control the manner in which clock signals are transmitted to the dual-port memory cell. The use of multiple clock tuners can allow a user to control which of the two input ports will receive its clock pulse first, as well as the time difference between the arrival of each signal at its clock port.

Figure 1:
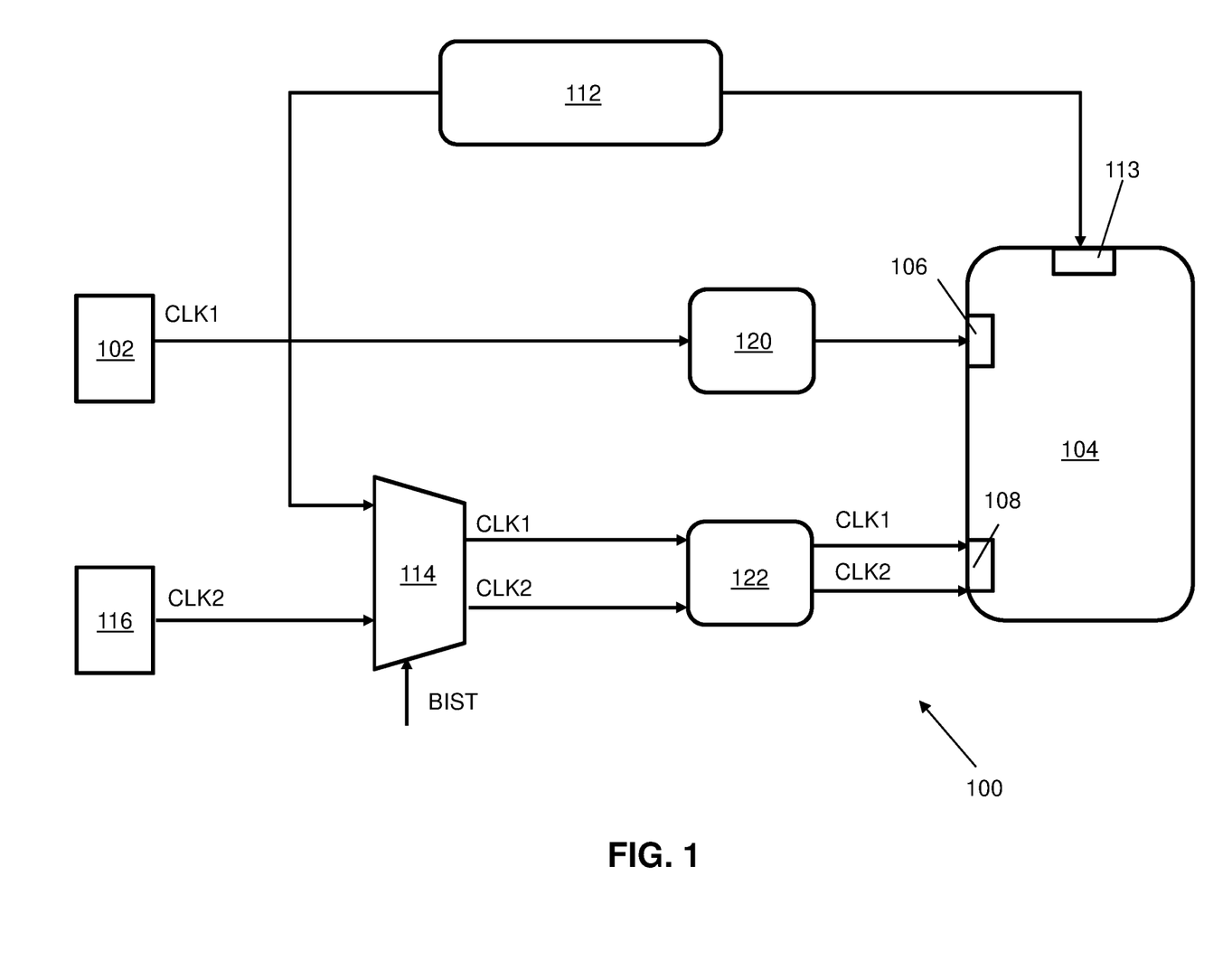
FIG. 1 shows a schematic view of a system for transmitting clock signals asynchronously to a dual-port memory cell according to embodiments of the disclosure.

FIG. 1 provides a schematic view of a system 100 according to embodiments of the disclosure. System 100 may include a source clock 102 to generate a clock signal, i.e., a periodic wave that oscillates between "high" and "low" voltage levels to define the frequency at which a device operates. Source clock 102 may include or otherwise may be coupled to a clock generator (e.g., one or more electronic oscillators such as a crystal oscillator or any type of local oscillator "LO" circuit on a device) for driving and synchronizing the operation of various components. Source clock 102 may include various subcomponents, e.g., a resonant circuit, amplifier, power supply coupling, etc., for producing a waveform at a desired frequency. Source clock 102 may output its waveform, indicated as "CLK1." Clock signal CLK1 produced from source clock 102 may be delivered to a dual port memory cell 104 through a first port 106 and a second port 108, respectively, and through intermediate components as discussed herein. Source clock 102 and its clock signal CLK1 thus may be configured for operating and testing both ports 106, 108 of dual-port memory cell 104. The signals generated with source clock 102 are deterministic, i.e., the clock edges of its generated clock signals do not vary except in the case where further components of system 100 modify the clock signal, as discussed herein.

To electrically test only second port 108 of dual-port memory cell 104, system 100 may include a logic circuit 112 coupled to a logic port 113 of dual-port memory cell 104, e.g., to selectively enable or disable access transistors (not shown) therein, based on whether only first port 106 or second port 108 will be tested. Logic circuit 112 may be electrically coupled to a multiplexer 114, i.e., an electrical component connected to multiple inputs, and configured to transmit only one of the multiple inputs as an output. Multiplexer 114 can receive clock signal CLK1 from source clock 102 as a first alternate input, or a second clock signal CLK2 from an additional clock 116. Additional clock 116 may be similar or identical to source clock 102, and may produce clock signal CLK2 that is configured as a function clock for only second port 108 of dual-port memory cell 104. Here, signal CLK1 is used to test either first port 106 or second port 108 of dual-port memory cell 104. When self test signal BIST is set to logic high (i.e., an "under test" mode is enabled), only signal CLK1 can go through multiplexer 114, while CLK2 is used for other functions (i.e., it does not enter first port 106 or second port 108). Multiplexer 114, additionally, can be coupled to a BIST signal (indicated "BIST" in FIG. 1) to enable or disable multiplexer 114 based on whether a dual-port memory cell 104 is undergoing a self-test.

Although logic circuit 112, multiplexer 114, and additional clock 116 enable independent self-testing of each port 106, 108, these components in and of themselves cannot allow one clock signal (e.g., CLK1) to be transmitted asynchronously to both ports 106, 108 of dual-port memory cell 104. Further components of system 100, however, allow asynchronous testing of ports 106, 108 without any direct action by dual port memory cell 104 and/or logic circuit 112 being required.

System 100 may include, e.g., a first clock tuner 120 coupled between source clock 102 and first port 106, and a second clock tuner 122 coupled between source clock 102 and second port 108. Each clock tuner 120, 122 may immediately precede its respective port 106, 108, such that no intermediate components are electrically coupled therebetween. As shown, further components (e.g., multiplexer 114) may be electrically coupled between source clock 102 and/or clock tuner(s) 120, 122 to control whether clock signal CLK1 from source clock 102 is transmitted to each port 106, 108. It is understood that embodiments of the disclosure may be implemented in the case where source clock 102 is transmitting clock signal CLK1 to first port 106 and second port 108 (e.g., when signal BIST causes multiplexer 114 to transmit CLK1 to second port 108 in parallel with first port 106).

Clock tuner(s) 120, 122 may be embodied as any currently known or later developed electrical component to affect the timing of a clock signal without otherwise affecting its attributes (e.g., amplitude and/or frequency). Such components may include, e.g., one or more multiplexers coupled to one or more buffers to selectively delay signals passing therethrough, as described herein. Clock tuner(s) 120, 122 in various alternative implementations may include, e.g., phase locked loops (PLLs), voltage and/or current sources, physical unclonable function (PUF), and/or any other component for modifying the timing (i.e., signal phase) of clock edges within a clock signal. However embodied, clock tuner(s) 120, 122 may receive clock signal CLK1 as an input and produce a modified version of clock signal CLK1, which differs only by a predetermined time delay (e.g., ten nanoseconds, fifty nanoseconds, etc.). Each clock tuner 120, 122, in addition, may be external to dual-port memory cell 104 to allow clock tuner(s) 120, 122 to operate independently of dual-port memory cell 104. Clock tuner(s) 120, 122 may be similar or identical in their composition, but each may be configured to delay clock signal CLK1 by a distinct delay time with respect to the other. Thus, when either or both of clock tuner(s) 120, 122 are active, clock signal CLK1 will reach first port 106 at a different time from second port 108. The amount of delay may be selected to simulate the characteristics of a device, or type of device, where dual-port memory cell 104 is implemented.

Figure 2:
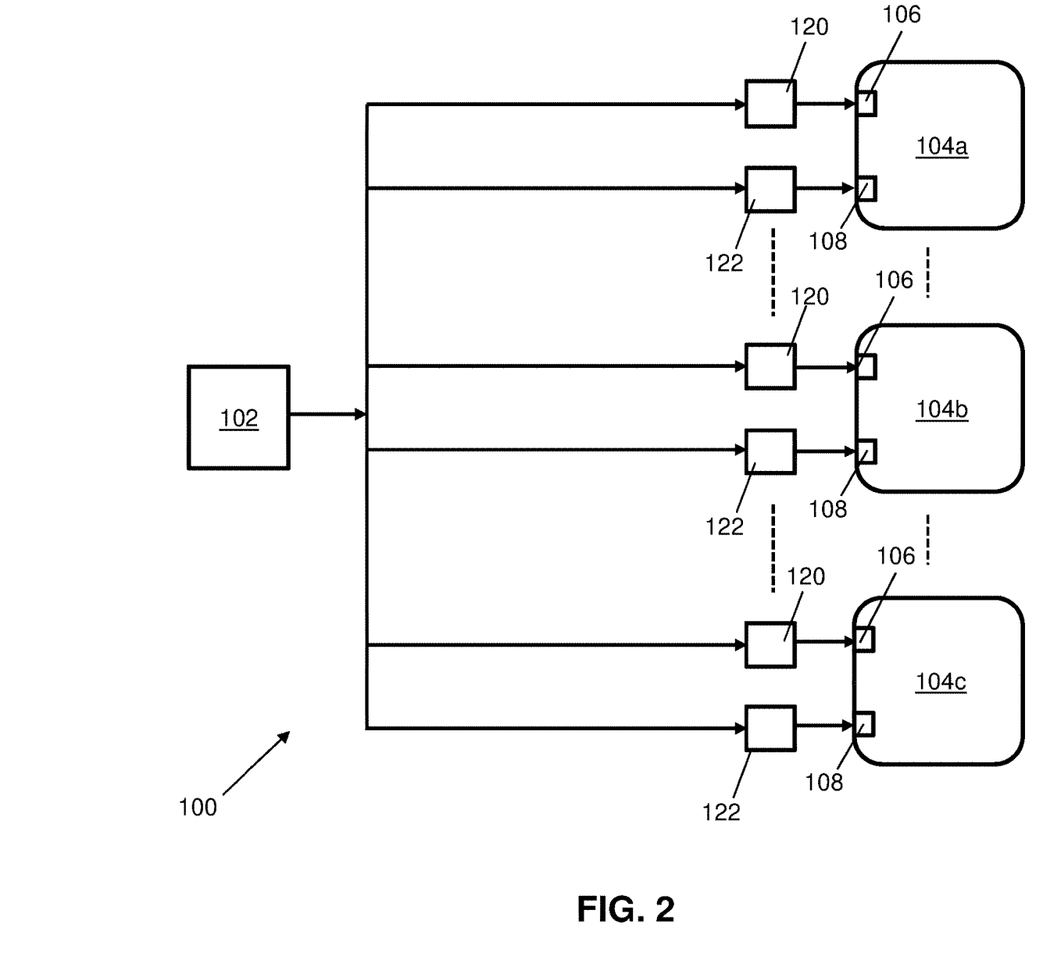
FIG. 2 shows a schematic view of a source clock coupled to several clock tuners and dual-port memory cells in a system according to embodiments of the disclosure.

Referring to FIG. 2, embodiments of system 100 may be scalable for testing of multiple dual-port memory cells 104a, 104b, 104c, using one source clock 102 and/or relatively few source clocks 102. As shown by example in FIG. 2, multiple dual-port memory cells 104a, 104b, 104c each may have a set of ports including first port 106 and second port 108. Each port 106, 108 in turn may be electrically coupled to first clock tuner 120 or second clock tuner 122, where applicable. As with other implementations discussed herein, click tuners 120, 122 may be external to and operationally independent of each memory cell 104a, 104b, 104c. Despite the presence of multiple memory cells 104a, 104b, 104c, and corresponding pairs of clock tuners 120, 122, one source clock 102 may generate a clock signal to be transmitted to each set of clock tuners 120, 122 and corresponding dual-port memory cells 104a, 104b, 104c, in parallel. Any desired number of memory cells 104 may be included in system 100 by this arrangement, and phantom lines are shown in FIG. 2 to indicate an indeterminate number of memory cells 104 and clock tuners 120, 122.

Figure 3:
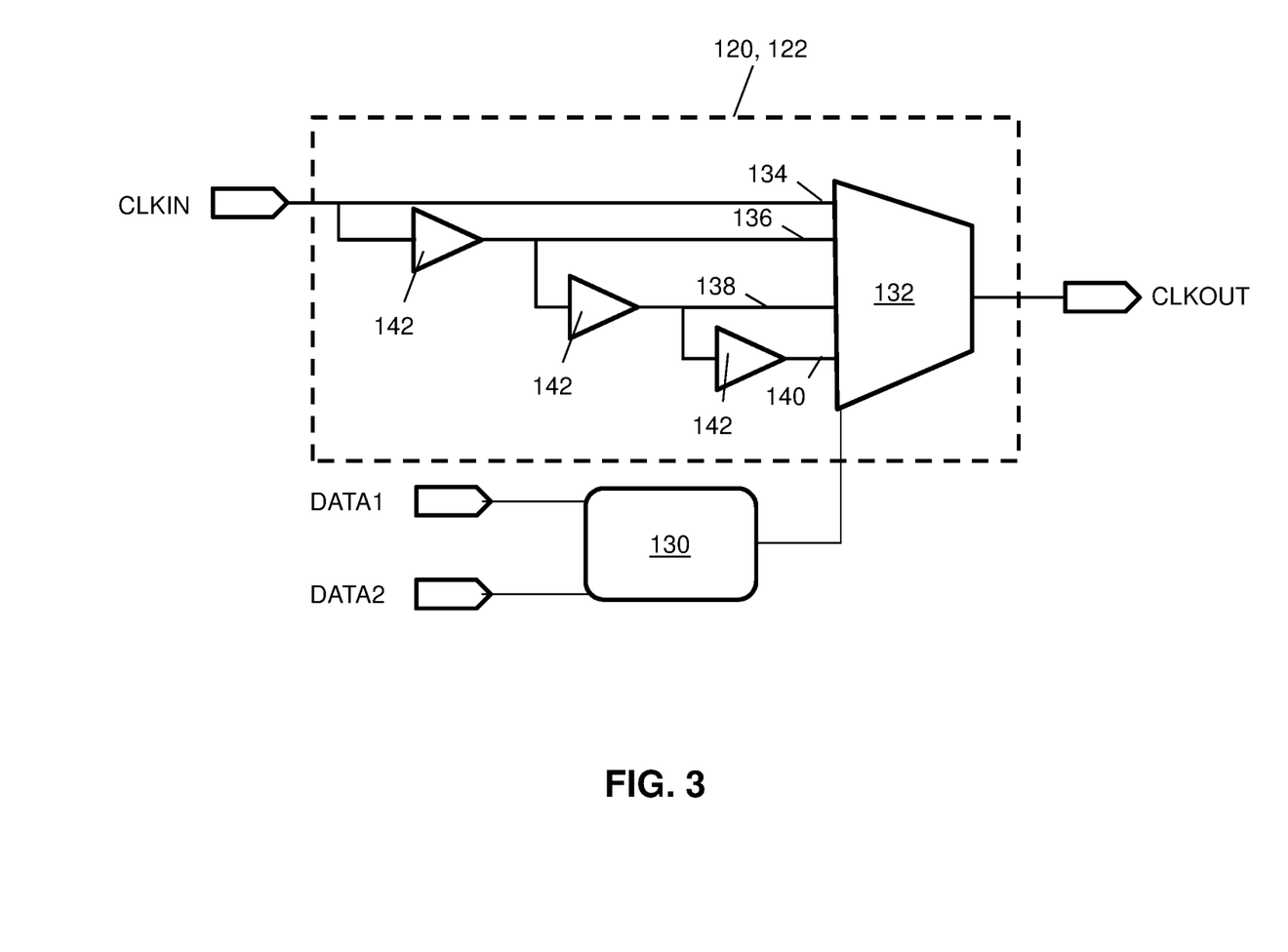
FIG. 3 shows a schematic view of a clock tuner in the form of a multiplexer and buffers according to embodiments of the disclosure.

FIG. 3 depicts an expanded schematic view of first clock tuner 120 or second clock tuner 122, together with a controller 130, according to further implementations. Although clock tuner(s) 120, 122 may take a variety of forms and may include any currently known or later developed digital circuit for delaying the propagation of a clock signal without otherwise changing its properties (e.g., frequency, voltage amplitude, etc.), some implementations may provide a multiplexer-based circuit to create a desired amount of delay. Varying the time delay in clock tuner(s) 120, 122, may allow a user to conduct multiple tests on memory cell(s) 104 without physically changing the self-test circuitry in system 100. FIG. 3 depicts clock tuner(s) 120, 122 as receiving an incoming clock pulse at an input node "CLKIN," and yielding an outgoing clock pulse at node line "CLKOUT." Clock tuner(s) 120, 122 may include a multiplexer 132, i.e., a digital element configured to select one of several alternate digital input signals for transmission as a digital output signal. The output of multiplexer 132 may be directly coupled to node CLKOUT and thus may define a digital output from clock tuner(s) 120, 122. Multiplexer 132 may also be digitally coupled to controller 130, such that controller 130 is capable of selecting one of several digital inputs to multiplexer 132 for transmission, as discussed herein.

Multiplexer 132 may have any desired number of input lines, and each may be configured to transmit a clock signal having a distinct time delay. A first input line 134 may directly connect input node CLKIN to multiplexer 132, and thus may not significantly delay the time for any clock signals passing through clock tuner(s) 120, 122. A second input line 136, third input line 138, and fourth input line 140 each may include at least one buffer 142 for delaying the travel time of a clock signal as it passes through clock tuner(s) 120, 122. A "buffer" refers to an electronic circuit element that provides either no voltage or otherwise converts an input voltage into an output voltage that is substantially the same as the input voltage. Buffers serve no amplification function, and simply cause a time delay in signals passing therethrough. The structure and function of buffers in digital circuits in various configurations is known in the art and thus not discussed in further detail. Second input line 136 may include only one buffer 142, third input line 138 may include two buffers (e.g., buffer 142 from second input line 136 and another buffer 142), while fourth input line 140 may include three buffers. Thus, one buffer 142 may be present in multiple input lines 134, 136, 138, 140 of clock tuner(s) 120, 122. It is understood that the example configuration of buffers 142 and input lines 134, 136, 138, 140 may vary between clock tuners 120, 122 and/or configurations of system 100 to provide different amounts of delay.

According to an example, first input line 134 may not cause any detectable delay, second input line 136 may cause a delay of ten picoseconds (ps), third input line 138 may cause a delay of twenty ps (i.e., total delay time from two buffers 142), and fourth input line 140 may cause a delay of thirty ps (i.e., the total delay time from three buffers 142). Although four input lines 134, 136, 138, 140 are shown as an example in FIG. 3, it is understood that any conceivable number of input lines may be coupled to multiplexer 132 to provide a corresponding number of possible time delays. First input line 134 may be selected in one clock tuner 120, 122 while another input line 136, 138, 140, may be selected in the other clock tuner 120, 122 to create a delay in only one clock tuner 120. In further implementations, input lines 134, 136, 138, 140 with buffers 142 therein may be selected in each clock tuner 120, 122 to delay the clock signal for both input ports 106, 108 (FIGS. 1, 2) to dual-port memory cell 104.

Controller 130 may be coupled to multiplexer 132, e.g., by one or more data couplings, to select which of the multiple input lines 134, 136, 138, 140 will relay its clock signal (whether delayed or non-delayed as discussed herein) to output node CLKOUT. The digital signals for selecting one of the various input lines 134, 136, 138, 140 may be input to controller 130 via ports "DATA1," "DATA2," which may represent commands issued by respective portions of a device, and/or user of system 100. Controller 130 may take the form of a computing device configured to electrically control multiplexer 132 (e.g., based on internal algorithms and/or external control systems for operating system 100) to select only one of input lines 134, 136, 138, 140 to produce a desired delay time. The selecting of one input line 134, 136, 138, 140 may be based on one or more self-test parameters for dual-port memory cell 104, and/or may be based on structural and/or operational properties of a device where dual-port memory cell 104 is used. However embodied, controller 130 may ensure that clock signals transmitted from output node CLKOUT are asynchronous with clock signals transmitted from a different clock tuner 120, 122 (e.g., they arrive at dual-port memory cell 104 at different times).

Figure 4:
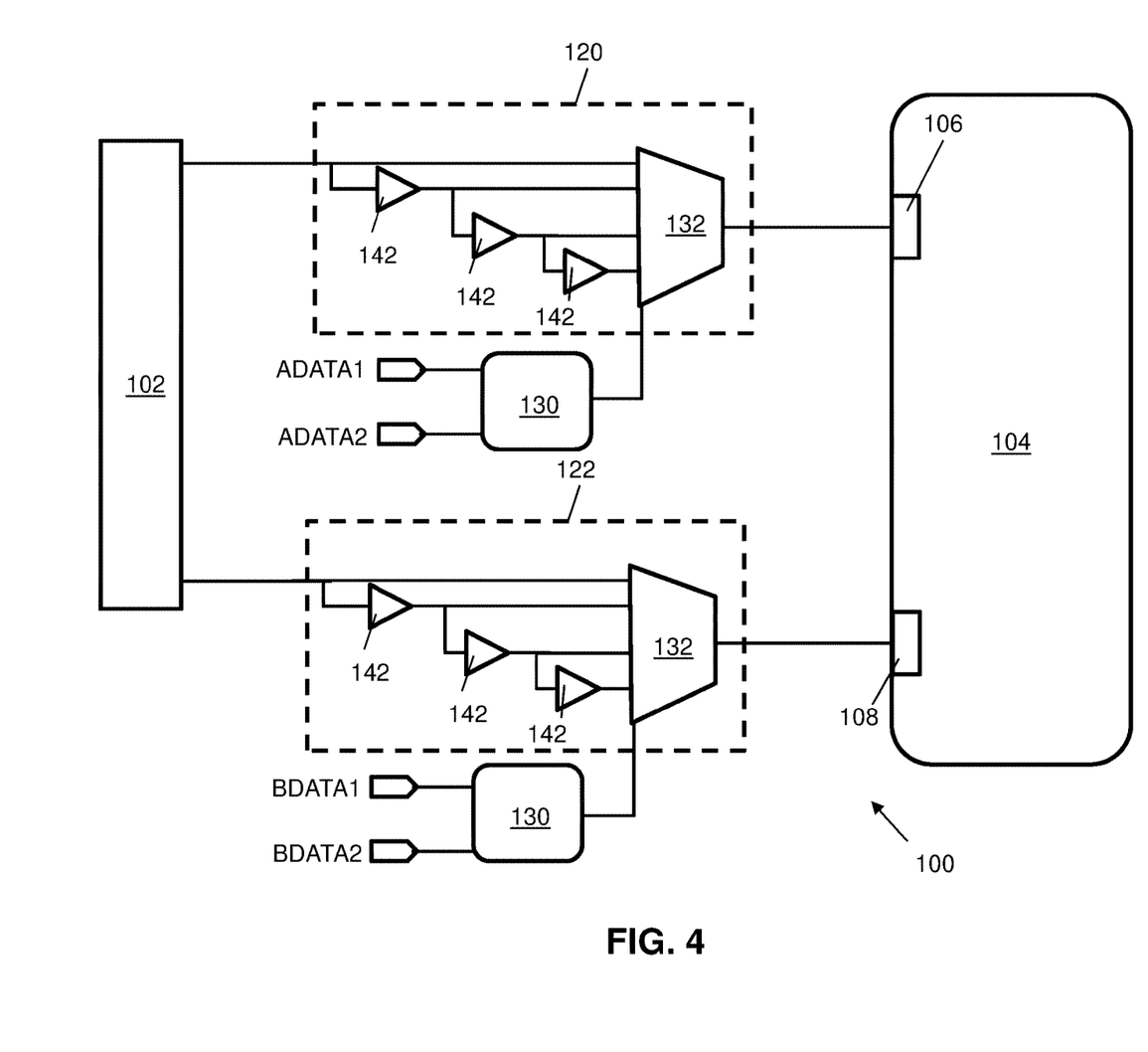
FIG. 4 shows an expanded schematic view of a system for transmitting clock signals asynchronously to a dual-port memory cell according to further embodiments of the disclosure.

Referring to FIG. 4, an example configuration of system 100 is shown in which each clock tuner 120, 122 has a respective multiplexer 132 therein. The separate labeling for each input line 134, 136, 138, 140 (FIG. 3) is omitted from FIG. 4 solely for clarity of illustration, but each of the several input lines 134, 136, 138, 140 remains visible in FIG. 4. In such a configuration, source clock 102 generates two parallel clock signals, with one being provided to first clock tuner 120 and another being provided in parallel to second clock tuner 122. Each clock tuner 120, 122 may include multiplexer 132 with multiple input lines, each being routed through a corresponding number of buffers 142 (e.g., between zero and four buffers in each input line). The output from each multiplexer 132, and hence from each clock tuner 120, 122 may be transmitted to first input port 106 or second input port 108 of dual-port memory cell 104. In an example configuration, controller 130 may control a corresponding clock tuner 120, 122 to select one of its input lines and a corresponding delay time in each clock tuner 120, 122. Although two instances of controller 130 are shown in FIG. 4, these may represent two portions of the same controller. In further examples, multiple controllers 130 may be coupled to all clock tuners in system 100 and may operate independently of each other, e.g., with one coupled to first clock tuner 120 and another coupled second clock tuner 122. However implemented, controller 130 may be coupled to one set of data nodes (e.g., nodes ADATA1, ADATA2) to select one input line in clock tuner 120, and/or another set of data nodes (e.g., BDATA1, BDATA2) to select one input line in clock tuner 122. Thus, each clock tuner 120, 122 and/or controller 130 may be capable of delaying the clock signal to first input port 106 by a different delay time than the amount of delay for clock signals transmitted to second input port 108.

Figure 5:
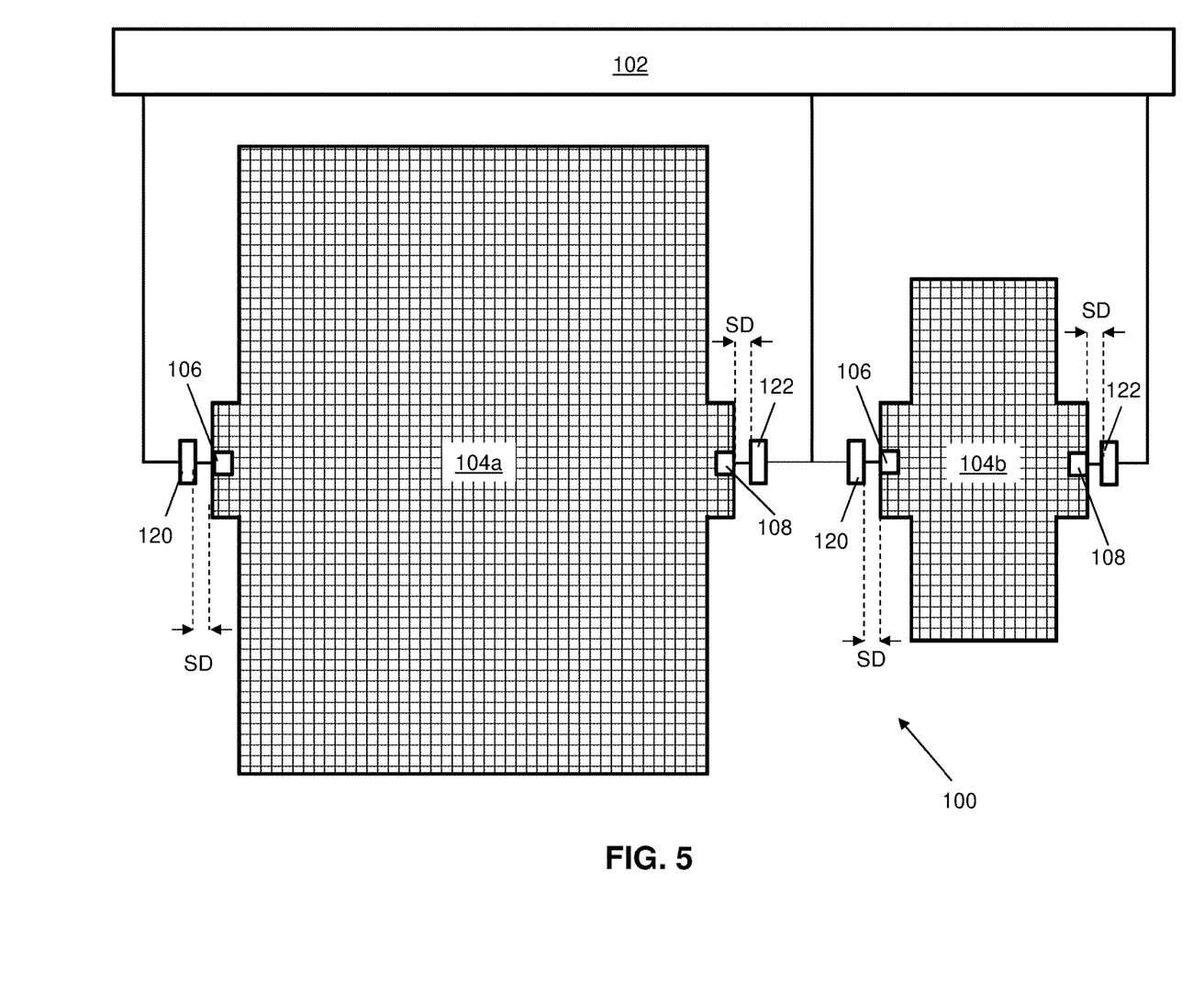
FIG. 5 shows a schematic view of multiple dual-port memory cells coupled to clock tuners according to embodiments of the disclosure.

FIG. 5 depicts an implementation of system 100 according to further embodiments, in which two dual-port memory cells 104a, 104b of different sizes and/or configurations may be configured for an asynchronous self-test. As shown, one source clock 102 may be coupled to two first clock tuners 120 and two second clock tuners 122. Each pair of first clock tuner 120 and second clock tuner 122 may be coupled to first input port 106 or second input port 108, respectively, of one dual-port memory cell 104a, 104b. One dual-port memory cell 104a may be significantly larger than another dual-port memory cell 104b in one system 100, e.g., due to differences in the number of transistors therein, and/or the type of RAM being implemented. Despite these structural differences of each dual-port memory cell 104a, 104b, each clock tuner 120, 122 may be external to and operationally independent of dual-port memory cells 104a, 104b. In an example implementation, a separation distance SD between each clock tuner 120, 122 and its respective dual-port memory cell 104a, 104b may be substantially identical (e.g., approximately ten micrometers (μm) or other arbitrary distance). Such physical spacing may ensure that clock tuner(s) 120, 122 have substantially the same effect on their respective dual-port memory cells 104a, 104b during self-test. In this manner, source clock 102 can cooperate with clock tuners 120, 122 to deliver clock signals asynchronously to dual-port memory cells 140a, 104b for self-testing. Such functions may be possible without further modification and/or adaptation of each dual-port memory cell 104a, 104b to the test circuitry in system 100. Moreover, one source clock 102 may be capable of self-testing multiple dual-port memory cells 104a, 104b, etc., provided each dual-port memory cell 104a, 104b is coupled to source clock 102 through a respective pair of clock tuners 120, 122 as discussed herein.

In some embodiments, a "RAM integrated circuit chip" may include one or more dual-port memory cells 104a, 104b. Dual-port memory cells 104a, 104b may be part of an array of dual-port memory cells on the RAM integrated circuit chip. Each clock tuner 120, 122 may be external to and operationally independent of the RAM integrated circuit chip and their respective dual-port memory cells 104a, 104b.

Figure 6:
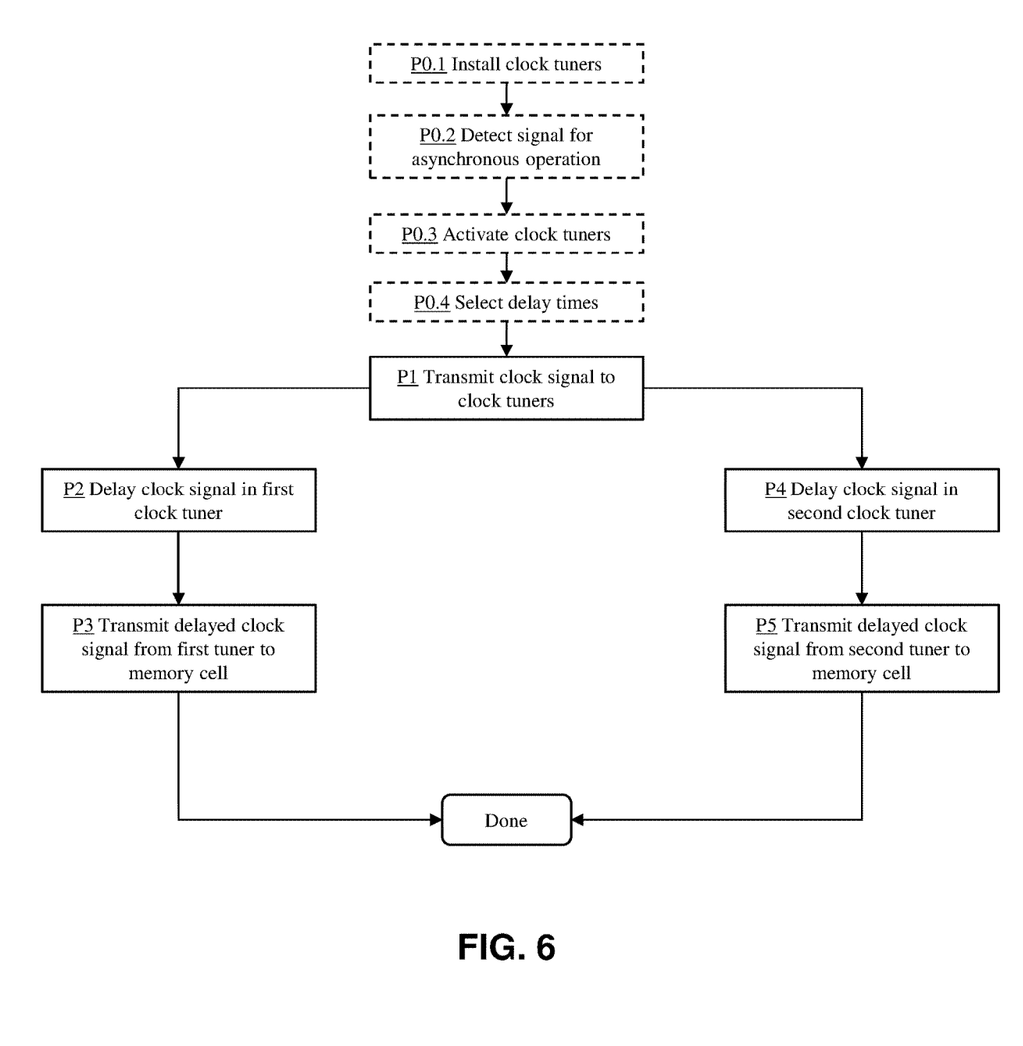
FIG. 6 shows an illustrative flow diagram of a method for transmitting clock signals asynchronously to dual-port memory cells according to embodiments of the disclosure.

Referring to FIGS. 3, 4, and 6, embodiments of system 100, and the various subcomponents discussed herein, may be adapted for methods to electrically test dual-port memory cell(s) 104 with asynchronously-transmitted clock signals. As noted herein, dual-port memory cell(s) 104 may be an SRAM and/or other memory element configured to operate independently of source clock 102 and clock tuner(s) 120, 122. FIG. 6 provides an illustrative flow diagram of methods according to embodiments of the disclosure. It is understood that various operations and/or features may be omitted and/or added based on the configuration of system 100 and/or the type of testing to be performed. It is also understood that such methods may be performed on several dual-port memory cells 104 simultaneously or sequentially, and/or with one instance of system 100 or multiple implementations of system 100.

Methods according to the disclosure may include several preliminary operations, which may be implemented as part of and/or separately from various methods described herein. Examples of such preliminary operations, processes P0.1, P0.2, P0.3, P0.4, are shown in phantom in FIG. 6. Process P0.1 may include installing first clock tuner 120 and second clock tuner 122 within a digital circuit (e.g., system 100) at positions that are equidistant from respective input ports 106, 108 to be tested. In an example, the separation distance between each clock tuner 120, 122 and its respective input port 106, 108 may be ten micrometers (μm), or any other arbitrary distance to ensure operational uniformity.

Regardless of the manner in which system 100 is provided and/or formed, process P0.2 may include detecting a signal for asynchronous operation, e.g., via one of ports ADATA1, ADATA2, ADATA3, ADATA4 to controller 130. Before receiving such an input, controller(s) 130 may cause each clock tuner 120, 122 to impose no delay (e.g., signals will pass through an input line without any buffers 142). In such a state, clock tuners 120, 122 may be inactive and have no effect on clock signals transmitted to dual-port memory cells 104a, 104b. When a signal for asynchronous operation is received, controller 130 may implement further steps to transmit clock signals asynchronously to dual-port memory cells 104a, 104b. For example, process P0.3 may include activating clock tuner(s) 120, 122 by causing clock signals in one or both clock tuner(s) 120, 122 to pass through buffer(s) 142 before reaching dual-port memory cell 104. In this state, controller(s) 130 may also select delay times for each clock tuner 120, 122 in process P0.4 to conduct several types of tests and/or to change whether first input port 106 or second input port 108 receives its clock signal from source clock 102 first.

When clock tuner(s) 120, 122 are active, methods according to the disclosure may include a first process P1 of causing source clock 102 to generate a clock signal, which is then transmitted to clock tuner(s) 120, 122 in parallel. Process P2 may involve delaying the clock signal by a first delay time in first clock tuner 120. The first delay time may be, e.g., the time selected in process P0.4, where applicable. In process P3, first clock tuner 120 transmits the delayed clock signal to first port 106 of dual-port memory cell 104. While processes P2, P3 are ongoing, methods according to the disclosure may include process P4 of delaying the clock signal in second clock tuner 122 by a delay time that is different from that imposed by first clock tuner 120. According to one example, the different delays may cause the clock signal to leave second clock tuner 122 approximately thirty ps later than it leaves first clock tuner 120. Process P4 may include the elapsing of the second delay time in the second clock tuner, and thus process P4 may be concurrent with both processes P2, P3 if the second delay time is longer than the first. Once process P4 includes (i.e., the second delay time elapses) second clock tuner 122 may transmit its clock signal to second port 108 of dual-port memory cell 104. In cases where the first delay time is longer than the second delay time, process P2 of delaying the clock signal in first clock tuner 120 may be concurrent with processes P4, P5. The method may then conclude ("Done"), thereby causing second port 108 to receive the clock signal asynchronously with when the same clock signal is transmitted to first port 106. Additionally, any and/or all of the processes discussed herein may be implemented without any active involvement of dual-port memory cell 104, and/or other components apart from source clock 102, clock tuners 120, 122, and/or controller 130 where applicable.

Embodiments of the disclosure may provide several technical and commercial advantages, some of which are discussed herein as examples. As noted throughout the disclosure, embodiments of system 100 may be operationally independent of dual-port memory cell(s) 104. Thus, system 100 may provide self-testing of several dual-port memory cells 104 regardless of the size, configuration, and/or type of memory. Additionally, embodiments of the disclosure can be selectively activated or deactivated to allow single-port testing and/or synchronous testing of memory cell(s) 104 under desired conditions, while allowing the same hardware to conduct an asynchronous self-test according to various embodiments. Embodiments of the disclosure also allow asynchronous self-tests of input ports 106, 108 to be performed with different amounts of delay via multiplexers 132, without physically changing the testing hardware within system 100.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a source clock configured to generate a clock signal;
a first dual-port memory cell having a first input port for transmitting a first clock input to the first dual-port memory cell, and a second input port coupled to the source clock and configured for transmitting a second clock input to the first dual-port memory cell;
a second dual-port memory cell having a third input port and a fourth input port, wherein the second dual-port memory cell is larger than the first dual-port memory cell;
a first clock tuner coupled between the source clock and the first input port of the first dual-port memory cell, the first clock tuner including a first multiplexer having a first plurality of input lines each coupled to the source clock and an output line coupled to the first input port of the first dual-port memory cell,
wherein the clock tuner delays the clock signal by one of a first plurality of delay times and transmits the clock signal to the first input port;
a second clock tuner coupled between the source clock and the third input port of the second dual-port memory cell, the second clock tuner including a second multiplexer having a second plurality of input lines each coupled to the source clock and an output line coupled to the third input port of the second dual-port memory cell,
wherein the third clock tuner delays the clock signal by one of a second plurality of delay times and transmits the clock signal to the third input port; and
a controller electrically coupled to the first multiplexer of the first clock tuner and the second multiplexer of the second clock tuner, the controller including a set of data input ports configured to select one of the first plurality of input lines and one of the second plurality of input lines for delaying the clock signal.

2. The system of claim 1, wherein the first dual-port memory cell comprises a static RAM (SRAM) cell, and wherein the first input port and the second input port each comprise clock inputs to the SRAM cell.

3. The system of claim 1, wherein at least one of the first plurality of input lines includes a buffer configured to delay the clock signal by one of the first plurality of delay times.

4. The system of claim 3, wherein at least one of the first plurality of input lines of the first multiplexer is coupled between the source clock and the first multiplexer, and does not include the buffer.

5. The system of claim 3, wherein the buffer is included within at least two of the first plurality of input lines.

6. A system comprising:
a source clock configured to generate a clock signal;
a first dual-port memory cell having a first input port and a second input port;
a second dual-port memory cell having a third input port and a fourth input port, the second dual-port memory cell larger than the first dual-port memory cell;
a first clock tuner coupled between the source clock and the first input port of the first dual-port memory cell, wherein the first clock tuner delays the clock signal by one of a first plurality of delay times and transmits the clock signal to the first input port;

a second clock tuner coupled between the source clock and the second input port of the first dual-port memory cell, wherein the second clock tuner delays the clock signal by one of a second plurality of delay times and transmits the clock signal to the second input port;

a third clock tuner coupled between the source clock and the third input port of the second dual-port memory cell, wherein the third clock tuner delays the clock signal by one of the first plurality of delay times and transmits the clock signal to the third input port; and a fourth clock tuner coupled between the source clock and the fourth input port of the second dual-port memory cell, wherein the third clock tuner delays the clock signal by one of the second plurality of delay times and transmits the clock signal to the fourth input port.

7. The system of claim 6, wherein the first dual-port memory cell comprises a static RAM (SRAM) cell, and wherein the first clock tuner and the second clock tuner are external to the SRAM cell.

8. The system of claim 6, wherein the first clock tuner includes a first multiplexer having a first output line coupled to the first input port of the first dual-port memory cell, and a first plurality of input lines coupled between the first multiplexer and the source clock, at least one of the plurality of input lines including a first buffer configured to delay the clock signal by one of the first plurality of delay times; and wherein the second clock tuner includes a second multiplexer having a second output line coupled to the second input port of the first dual-port memory cell, and a second plurality of input lines coupled between the second multiplexer and the source clock, at least one of the plurality of input lines including a second buffer configured to delay the clock signal by one of the second plurality of delay times.

9. The system of claim 8, wherein at least one of the first plurality of input lines of the first multiplexer, and at least one of the second plurality of input lines of the second multiplexer, does not include a buffer.

10. The system of claim 8, wherein at least two of the first plurality of input lines includes the first buffer, and wherein at least two of the second plurality of input lines includes the second buffer.

11. The system of claim 8, wherein the controller is coupled to the first multiplexer and the second multiplexer, and is configured to select one of the first plurality of input lines and one of the second plurality of input lines for transmitting the clock signal.

12. A method comprising:

transmitting a clock signal to a first clock tuner and a second clock tuner, wherein the first clock tuner is coupled to a first input port of a first dual-port memory cell, wherein the second clock tuner is coupled to a second input port of the first dual-port memory cell;

transmitting the clock signal to a third clock tuner and a fourth clock tuner, wherein the third clock tuner is coupled to a third input port of a second dual-port memory cell, wherein the fourth clock tuner is coupled to a fourth input port of the second dual-port memory cell, wherein the second dual-port memory cell is larger than the first dual-port memory cell;

selecting one of a first plurality of delay times using a controller electrically coupled to a first multiplexer of the first clock tuner, the controller including a set of data input ports configured to select one of a first plurality of input lines for delaying the clock signal;

delaying the clock signal by the selected one of the first plurality of delay times in the first clock tuner;

delaying the clock signal by a selected one of a second plurality of delay times in the second clock tuner, wherein the selected one of the second plurality of delay times is different from the selected one of the first plurality of delay times; and transmitting the clock signal from the first clock tuner to the first input port of the first dual-port memory cell with the selected one of the first plurality of delay times; and transmitting the clock signal from the second clock tuner to the second input port of the first dual-port memory cell with the selected one of the second plurality of delay times, such that the first dual-port memory cell receives the clock signal at the second input port asynchronously with the clock signal at the first input port.

13. The method of claim 12, wherein the first dual-port memory cell comprises a static RAM (SRAM) cell, and wherein the delaying in the first clock tuner and the second clock tuner occurs outside of the SRAM cell.

14. The method of claim 12, further comprising installing the first clock tuner and the second clock tuner, such that a separation distance between the first clock tuner and the first dual-port memory cell is approximately equal to a separation distance between the second clock tuner and the first dual-port memory cell.

15. The method of claim 14, wherein the first clock tuner and the second clock tuner operate independently of the first dual-port memory cell.

16. The method of claim 12, further comprising activating the first clock tuner and the second clock tuner in response to detecting a signal to initiate an asynchronous operation of the first dual-port memory cell.

17. The method of claim 12, wherein delaying the clock signal by one of the first plurality of delay times includes causing the clock signal to pass through at least one of a first plurality of buffers in the first clock tuner, and wherein delaying the clock signal by one of the second plurality of delay times includes causing the clock signal to pass through at least one of a second plurality of buffers in the second clock tuner.

* * * * *